(12) United States Patent
Watanabe

(10) Patent No.: US 6,949,319 B2
(45) Date of Patent: Sep. 27, 2005

(54) METHOD FOR DETERMINING DEPTH OF FOCUS

(75) Inventor: Akira Watanabe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 143 days.

(21) Appl. No.: 10/278,785

(22) Filed: Oct. 24, 2002

(65) Prior Publication Data

US 2003/0215725 A1 Nov. 20, 2003

(30) Foreign Application Priority Data

May 20, 2002 (JP) ........................................ 2002-144212

(51) Int. Cl.$^7$ ................................................. G03F 9/00
(52) U.S. Cl. .................... 430/30; 430/322; 250/492.22; 250/492.2; 355/55; 355/624
(58) Field of Search .............. 430/30, 322; 250/492.22, 250/492.2; 355/55; 356/624

(56) References Cited

U.S. PATENT DOCUMENTS

2003/0106999 A1 * 6/2003 Komuro et al. ............. 250/307

FOREIGN PATENT DOCUMENTS

| JP | 11-040476 | 2/1999 |
|---|---|---|
| JP | 2000-260697 | 9/2000 |

* cited by examiner

Primary Examiner—John A. McPherson
Assistant Examiner—Daborah Chacko-Davis
(74) Attorney, Agent, or Firm—Volentine Francos & Whitt, PLLC

(57) ABSTRACT

A depth of focus determination method for finding an upper limit value of depth of focus during exposure, when a resist layer that has been formed on a substrate surface is at least exposed by reduction projection of a reticle mask and developed to form a resist pattern. When the depth of focus at a specific pattern of the resist pattern is an upper limit value $F_{max}$, a value Y expressed by the following equation (1) exhibits a maximum value or a minimum value. The upper limit value $F_{max}$ is a positive value.

$Y = f(F)$       Formula (1)

In Formula (1), F represents the depth of focus ($\mu$m), and f(F) represents a function with respect to the depth of focus, which function includes a top dimension ($\mu$m) and/or an edge dimension ($\mu$m) of a specific section of the specific pattern.

13 Claims, 9 Drawing Sheets

FIG. 9

| DEPTH OF FOCUS | -0.6 μm | -0.5 μm | -0.4 μm | -0.3 μm | -0.2 μm | -0.1 μm |
|---|---|---|---|---|---|---|
| PLAN VIEW | | | | | | |
| SECTIONAL VIEW | | | | | | |

| DEPTH OF FOCUS | 0 μm | +0.1 μm | +0.2 μm | +0.3 μm | +0.4 μm | +0.5 μm | +0.6 μm |
|---|---|---|---|---|---|---|---|
| PLAN VIEW | | | | | | | |
| SECTIONAL VIEW | | | | | | | |

METHOD FOR DETERMINING DEPTH OF FOCUS

BACKGROUND OF THE INVENTION

1. Field of the Invention

The present invention relates to a method for determining depth of focus when forming a resist pattern in a substrate utilizing photolithography.

More specifically, the present invention relates to a method for determining depth of focus when forming a resist pattern in a substrate surface of a semiconductor substrate or the like, which is formed of silicon or the like, by exposing the resist by reduction-projection of a reticle mask and developing the resist.

2. Description of the Related Art

Fabrication of semiconductor circuits has included a process in which a reticle mask, on a surface of which a circuit pattern is formed, is disposed over a semiconductor substrate (which may be referred to as a "wafer" hereafter). The circuit pattern is reduction-projected onto a resist layer formed on a surface of the wafer, using a reduction-projection exposure apparatus, a scanning type reduction-projection exposure apparatus or the like (referred to as an "exposure apparatus" below). The exposure process described above is repeated a number of times, until the semiconductor circuit is completed.

There have been continuing demands for a reduction of scale of a resist pattern that is formed on the surface of the wafer after exposure and development. A focusing position from which ultraviolet light is irradiated perpendicularly onto the wafer during exposure (below referred to as "depth of focus") is one of factors that determine whether the quality of the resist pattern that is formed is satisfactory or not. It is necessary to control upper/lower limits of the depth of focus during exposure, such that satisfactory resist patterns can be formed consistently. These upper/lower limits of depth of focus are assured by observing the resist pattern with a critical dimension measurement SEM from a perpendicular direction relative to the wafer (i.e., from above the wafer), measuring and evaluating finished dimensions (principally, a bottom dimension), and further, judging the form of the resist pattern that is being observed by visual inspection.

(Conventional Depth of Focus Determination Method)

A depth of focus determination method according to such a conventional method is concretely described below.

First, a resist layer is formed at a surface of a wafer, with the same reticle mask being used for each time of exposure at different exposure locations. At this time, exposure is performed with the depth of focus changing when the exposure location changes, and other exposure conditions being constant. Thereafter, the resist layer is developed as a whole, and thus a plurality of resist patterns for the respectively different depths of focus are formed on the wafer surface.

FIG. 6 is a schematic diagram showing an example of resist patterns formed on a wafer surface under exposure conditions with different depths of focus. FIG. 6 shows a plurality of sections into which the surface of a wafer 1 is divided in a checkered pattern. The sections are provided with resist patterns formed by exposing, by reduction-projection with a reticle mask, and developing the sections. The numerical values given in the sections represent depths of focus during exposure.

Evaluation of the resist pattern formed as described above is implemented by observing band-like resist patterns, which are formed in correspondence to a portion at the surface of the reticle mask, which portion is formed with a band-like pattern having a certain line width.

FIGS. 7A and 7B are schematic diagrams of the aforementioned band-like resist pattern. FIG. 7A shows a plan view of the band-like resist pattern, and FIG. 7B shows a sectional view, in a line width direction, of the band-like resist pattern. In FIGS. 7A and 7B, the reference numeral 1 represents the wafer and the reference numeral 2 represents the band-like resist pattern. The arrow B represents a bottom dimension and the arrow T represents a top dimension.

Evaluation of the band-like resist pattern is performed by judging a shape thereof. This judgement is performed by, at the same time as measurement of the bottom dimension represented by the arrow B in FIGS. 7A and 7B, which corresponds substantially to a dimension of the pattern formed on the surface of the wafer, obtaining a plan view of the band-like resist pattern as an image, as shown in FIG. 7A, and observing this image visually. This evaluation is further performed for each of the band-like resist patterns formed by exposing and developing at the respective depths of focus. The upper/lower limits of the depths of focus are judged by a procedure which is described below.

First, the bottom dimensions of the band-like resist patterns formed at the respective depths of focus are measured. FIG. 8 is a graph of these bottom dimensions.

FIG. 8 shows an example of variation of the bottom dimension of the band-like resist patterns with respect to depth of focus. When the band-like resist patterns used for measurement of the bottom dimensions shown in FIG. 8 are measured, exposure conditions other than the depth of focus are fixed such that a maximum value of the bottom dimension of the pattern for a depth of focus of 0 $\mu$m is 0.2 $\mu$m. As can be seen in FIG. 8, the bottom dimension varies along a parabolic curve, becoming greater with an increase in depth of focus, and then, beyond the maximum dimension (0.2 $\mu$m) exhibited for a depth of focus of 0 $\mu$m, becoming smaller in accordance with the curve.

Here, "depth of focus" refers to a focusing position of ultraviolet light that is irradiated during exposure, with respect to a perpendicular direction of the wafer. A positive value represents a focusing position further from a light source (exposure apparatus), and a negative value represents a focusing position closer to the light source. Moreover, a depth of focus of 0 $\mu$m (a reference value of the depth of focus) corresponds to the depth of focus for which the bottom dimension is at the maximum value with respect to depth of focus.

There are variations in the dimensions depending upon location in the wafer when the resist pattern is formed, even given the same exposure conditions, and it is necessary that these variations of the dimensions be constrained to within a certain range. This range of the variations of the dimensions must be determined such that, at least, the customers' minimum product quality requirements can be achieved, while giving due consideration to production costs of the semiconductor circuit and yields. In view of this point, the range of variation is generally of the order of ±10% relative to target dimensions.

In FIG. 8, the allowable values of the range of variations are ±10% relative to the target dimension, and the allowable range for the bottom dimension is 0.18 $\mu$m to 0.22 $\mu$m. Focusing depths corresponding to this range are within a range shown by a broken line L and a broken line H, that is, a range from −0.4 $\mu$m to +0.4 $\mu$m. In other words, a lower limit of the depth of focus is −0.4 $\mu$m and an upper limit is +0.4 $\mu$m.

However, as the depth of focus is increased, effects such as a remarkable decrease in resist layer thickness (below referred to as "film thickness reduction") and film peeling of a resist pattern surface layer portion occur in resist patterns exposed at a depth of focus greater than a certain value. Such film thickness reduction and film peeling start to be especially noticeable at a focus depth with a value such as that shown by a broken line H' in FIG. 8, and occur extremely often for values that are only slightly smaller than an upper limit value of the depth of focus found as described above. Consequently, an upper limit of the depth of focus that is allowable in practice would be 0.3 µm, as shown by the broken line H' in FIG. 8. In the following descriptions of the conventional art and the present invention, "upper limit value" means a value at or above which film thickness reduction and film peeling are especially noticeable.

Determination of such an upper limit value is performed by obtaining and visually observing an image of the form of the band-like resist pattern (a form corresponding to the plan view shown in FIG. 7A) using a critical dimension measurement SEM.

Specifically, the upper limit value is determined by implementing the following steps (1) and (2) in this order.

(1) Confirming a depth of focus at which, as the depth of focus increases, film peeling begins to occur.

(2) Comparatively judging various states, which are attributable to film thickness reduction, of the form of the band-like resist pattern for depths of focus around the depth of focus at which film peeling occurred.

For the comparative judgement of step (2), a relationship can be utilized in which, as the depth of focus increases, a difference between the top dimension and the bottom dimension becomes smaller as the occurrence of film thickness reduction becomes remarkable, as shown in FIG. 9.

FIG. 9 is a schematic diagram showing changes in the form of the band-like resist pattern with respect to changes in the depth of focus, as measured with bottom dimensions corresponding to the depths of focus shown in FIG. 8.

In FIG. 9, the values in the upper boxes are the depths of focus, the middle boxes are plan views showing the various forms of the band-like resist pattern for these depths of focus, and the lower boxes are sectional views showing the various forms of the band-like resist pattern for these depths of focus. The forms and relative dimensions of the band-like resist patterns shown in the middle and lower boxes are not intended to accurately reflect the forms and relative dimensions in actuality, but show general trends for the purposes of explanation.

As can be seen from FIG. 9, the resist layer thickness decreases remarkably at depths of focus of 0.3 µm and greater. In correspondence with this decrease, the difference between the top dimension and the bottom dimension diminishes rapidly.

(Problems With The Method of the Prior Art)

However, in the method for determining the upper limit of depth of focus of the prior art, because the band-like resist pattern is observed in a perpendicular direction of the wafer, as shown in the plan view of FIG. 7A, there are cases in which it is difficult to observe film peeling, which is attributable to peeling of the resist, whose principal component is in the wafer perpendicular direction. Moreover, any judgement in accordance with the above-described steps (1) and (2) is a sensory evaluation based on visual observation, and thus evaluation will be imprecise. Accordingly, an upper limit value of 0.3 µm determined as described above means "around about 0.3 µm" in practice, and accuracy is insufficient. That is, in practice the upper limit value represented by the broken line H' in FIG. 8 has a certain amount of play in the horizontal axis direction. This play means that there are inconsistencies attributable to the visual evaluation.

Such inconsistencies are substantially attributable to impreciseness resulting from the sensory evaluation, as shown in the following items (1) and (2). Further, although there is a way to deal with this impreciseness, as shown in item (3) below, it may be difficult to provide satisfactory accuracy because the evaluation is essentially a sensory evaluation. Moreover, in order to improve the accuracy in this way it is necessary to perform measurement and evaluation at many points, which is also disadvantageous.

(1) Because the observation of the band-like resist pattern is visual, accurate judgement of the form is difficult.

(2) There are inconsistencies in judgement attributable to operators who are visually judging the form of the band-like resist pattern.

(3) It is difficult to judge the form by observing only one location of the band-like resist pattern. In order to improve accuracy of judgement, it is necessary to compare this location with the band-like resist pattern at other peripheral vicinities.

Thus, when semiconductor circuits are being produced, in order that satisfactory resist patterns can be formed, it is necessary to periodically (and at other times as necessary) check a suitable range of the depth of focus, and provide feedback of results of this checking to a production line.

In particular, in continuous production, under relatively constant conditions in which resist patterns are repeatedly formed continuously with the same production conditions over a long period, the suitable range can be checked accurately and conveniently, but it is necessary to provide feedback of the results to the production line rapidly.

Furthermore, there are cases in which inconsistency factors in the production process relating to the formation of the resist pattern may become large due to changes in production conditions, adjustment and maintenance of a production line, unforeseen causes and the like. A primary demand is for the suitable range to be accurately determined without suffering the effects of such inconsistency factors of production.

In view of the above, the accuracy with which the conventional method finds the upper limit value is poor, and the conventional method has been unable to satisfactorily meet the needs of production.

SUMMARY OF THE INVENTION

The present invention is provided to solve the above-described problems. Specifically, an object of a first aspect of the present invention is to provide a method for determining depth of focus which can determine an upper limit of depth of focus conveniently and with good accuracy.

Further, an object of a second aspect of the present invention is to provide a method for determining depth of focus which can determine an upper limit of depth of focus with good accuracy and without being affected by production inconsistency factors related to the formation of resist patterns.

The objects described above are achieved by the present invention as follows. That is, the present invention includes:

<1> A method for determining depth of focus in a process for forming a resist pattern, the process for forming the resist pattern including: forming a resist layer on a substrate surface; exposing the resist layer with a reticle mask by reduction-projection; and developing the resist layer, and the method for determining depth of focus comprising:

measuring, for a plurality of values of the depth of focus, at least one of a top dimension and an edge dimension of a specific section of a specific pattern of a resist pattern; determining, for each of the plurality of values of the depth of focus, a value Y expressed by the following Formula (1):

$$Y=f(F) \quad \text{Formula (1)}$$

in which F represents the depth of focus and f(F) represents a function of the depth of focus F, which includes the at least one of a top dimension and an edge dimension; and finding an upper limit value of the depth of focus at the time of exposing the reticle mask, which upper limit value is a positive value $F_{max}$ at which the value Y exhibits one of a maximum and a minimum.

<2> The method for determining depth of focus of <1>, wherein the value Y in Formula (1) is expressed by the following Formula (2):

$$Y=\text{Top}(F) \quad \text{Formula (2)}$$

and in Formula (2), F represents the depth of focus, and Top(F) represents the top dimension of the specific section of the specific pattern for that depth of focus.

<3> The method for determining depth of focus of <1>, wherein the value Y in Formula (1) is expressed by the following Formula (3):

$$Y=\text{Edge}(F) \quad \text{Formula (3)}$$

and in Formula (3), F represents the depth of focus, and Edge(F) represents the edge dimension of the specific section of the specific pattern for that depth of focus.

<4> The method for determining depth of focus of <1>, wherein the value Y in Formula (1) is expressed by the following Formula (4):

$$Y=\text{Top}(F)/\text{Bot}(F) \quad \text{Formula (4)}$$

and in Formula (4), F represents the depth of focus, Top(F) represents the top dimension of the specific section of the specific pattern for that depth of focus, and Bot(F) represents a bottom dimension of the specific section of the specific pattern for that depth of focus.

<5> A method for determining depth of focus for forming a resist pattern, the process for forming the resist pattern including: forming a resist layer on a substrate surface; exposing the resist layer with a reticle mask by reduction-projection; and developing the resist layer, and the method for determining depth of focus comprising the step of finding an upper limit value of the depth of focus at the time of exposing the reticle mask, wherein, if the depth of focus at a first specific pattern of the resist pattern is at an upper limit value $F_{max1}$, a value Z expressed by the following Formula (5) exhibits a maximum, if the depth of focus at a second specific pattern of the resist pattern is at an upper limit value $F_{max2}$, the value Z expressed by the following Formula (5) exhibits a minimum, the upper limit value $F_{max1}$ and the upper limit value $F_{max2}$ satisfy a relationship represented by the following Formula (6):

$$Z=f_1(F)-f_2(F) \quad \text{Formula (5)}$$

$$0<F_{max1}<F_{max2} \quad \text{Formula (6)}$$

and in Formula (5), F represents the depth of focus, $f_1(F)$ represents a function of the depth of focus F which includes at least one of a top dimension and an edge dimension of a specific section of the first specific pattern, and $f_2(F)$ represents a function of the depth of focus F which includes at least one of a top dimension and an edge dimension of a specific section of the second specific pattern.

<6> The method for determining depth of focus of <5>, wherein the value Z in Formula (5) is expressed by the following Formula (7):

$$Y=\text{Edge}_1(F)-\text{Edge}_2(F) \quad \text{Formula (7)}$$

and in Formula (7), F represents the depth of focus, $\text{Edge}_1(F)$ represents the edge dimension of the specific section of the first specific pattern for that depth of focus, and $\text{Edge}_2(F)$ represents the edge dimension of the specific section of the second specific pattern for that depth of focus.

<7> A method for determining an upper limit value of depth of focus of an exposure apparatus comprising: providing a plurality of resist patterns under exposure conditions with respectively different depths of focus; measuring an upper face dimension in a specific direction of each of the plurality of resist patterns; detecting a point at which the upper face dimension is a minimum value; and determining the upper limit value of depth of focus from the detected point.

<8> A method for determining an upper limit value of depth of focus of an exposure apparatus comprising: providing a plurality of resist patterns under exposure conditions with respectively different depths of focus; measuring an upper face dimension in a specific direction and a lower face dimension in the specific direction of each of the plurality of resist patterns; calculating, from the upper face dimension and the lower face dimension, an inclination portion dimension in the specific direction; detecting a point at which the inclination portion dimension is a maximum value; and determining the upper limit value of depth of focus from the detected point.

<9> The method for determining depth of focus of <8>, wherein calculating an inclination portion dimension includes dividing a value obtained by subtracting the upper face dimension from the lower face dimension by 2.

<10> A method for determining an upper limit value of depth of focus of an exposure apparatus comprising: providing a plurality of resist patterns under exposure conditions with respectively different depths of focus; measuring an upper face dimension in a specific direction and a lower face dimension in the specific direction of each of the plurality of resist patterns; finding a proportional ratio of the upper face dimension relative to the lower face dimension; detecting a point at which the proportional ratio is a minimum value; and determining the upper limit value of depth of focus from the detected point.

<11> A method for determining an upper limit value of depth of focus of an exposure apparatus comprising: providing a plurality of resist pattern groups under exposure conditions with respectively different depths of focus, the resist pattern groups including a first pattern and a second pattern, wherein a dimension of the second pattern in a specific direction is greater than a dimension of the first pattern in the specific direction; measuring an upper face dimension of the first pattern in the specific direction and a lower face dimension of the first pattern in the specific direction; calculating, from the upper face dimension of the first pattern and the lower face dimension of the first pattern, an inclination portion dimension of the first pattern in the specific direction; measuring an upper face dimension of the second pattern in the specific direction and a lower face dimension of the second pattern in the specific direction; calculating, from the upper face dimension of the second pattern and the lower face dimension of the second pattern, an inclination portion dimension of the second pattern in the specific direction; finding a value by subtracting the inclination portion dimension of the second pattern from the inclination portion dimension of the first pattern; detecting a point at which the value found by subtracting the inclination portion dimension of the second pattern from the inclination portion dimension of the first pattern is a maximum value; and determining the upper limit value of depth of focus from the detected point.

<12> The method for determining depth of focus of claim 11, wherein the dimension of the second pattern in the specific direction is at least 1.2 times the dimension of the first pattern in the specific direction.

<13> The method for determining depth of focus of claim 11, wherein calculating an inclination portion dimension of the first pattern includes dividing a value obtained by subtracting the upper face dimension of the first pattern from the lower face dimension of the first pattern by 2, and calculating an inclination portion dimension of the second pattern includes dividing a value obtained by subtracting the upper face dimension of the second pattern from the lower face dimension of the second pattern by 2.

BRIEF DESCRIPTION OF THE DRAWINGS

FIG. 9 is a schematic diagram showing changes in the form of the band-like resist pattern with changes in the depth of focus, as measured with bottom dimensions corresponding to the depths of focus shown in FIG. 8. The values in the upper boxes show the depths of focus, the middle boxes are plan views showing the various forms of the band-like resist pattern for these depths of focus, and the lower boxes are sectional views showing the various forms of the band-like resist pattern for these depths of focus.

DESCRIPTION OF THE PREFERRED EMBODIMENTS

Figure 1A:
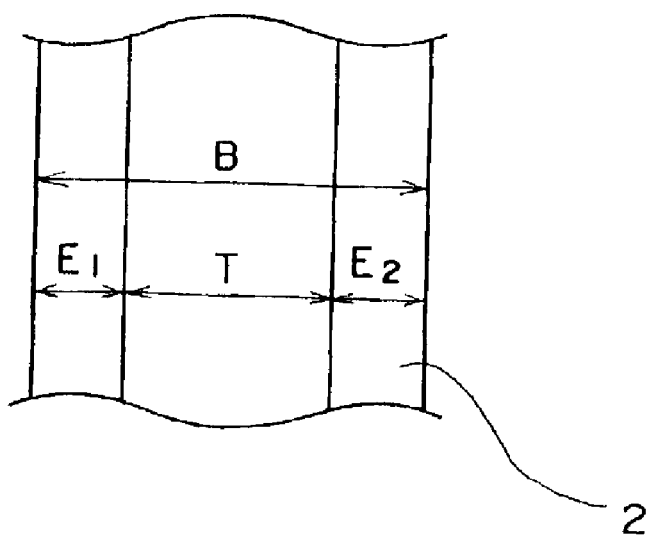
FIG. 1A is a schematic view showing a plan view of a band-like resist pattern, which shows dimensions in a line width direction of the band-like resist pattern which can be utilized when determining an upper limit of depth of focus in the present invention.

The present invention is explained below, with the explanation being broadly divided into a first aspect of the present invention, a second aspect of the present invention and common features of the first and second aspects of the present invention, in that order.

First Aspect of the Present Invention

The first aspect of the present invention is a method for determining depth of focus which finds an upper limit value of depth of focus for a time of exposure when a resist pattern is being formed. The resist pattern is formed in a resist layer formed on a surface of a substrate, by exposing a reticle mask onto the resist layer by reduction-projection and developing the resist layer.

When the depth of focus at a specific pattern of the resist pattern is the upper limit value, $F_{max}$, a value Y expressed by the following Formula (1) exhibits a maximum or a minimum. The upper limit value $F_{max}$ is a positive value.

$$Y=f(F) \qquad \text{Formula (1)}$$

In Formula (1), F represents depth of focus ($\mu$m), and f(F) represents a function with respect to the depth of focus F. This function is dependent on a top dimension ($\mu$m) and/or an edge dimension ($\mu$m) at a specific section of the specific pattern.

According to the first aspect of the invention described above, a depth of focus determination method in which an upper limit value of the depth of focus can be conveniently determined with good accuracy can be provided.

Formation of the resist pattern is carried out with resist pattern formation conditions apart from the depth of focus, such as exposure conditions and the like, being constant. Additionally, in the present invention "specific pattern" means resist patterns formed with respective depths of focus in correspondence to a portion of a pattern formed at a surface of the reticle mask, which portion has a specific shape and dimensions.

Specifically, the specific pattern may mean, for example, a band-like resist pattern formed in correspondence to a band-like pattern with a width of 1 $\mu$m at the surface of the reticle mask, a circular resist pattern formed in correspondence to a circular pattern with a diameter of 1 $\mu$m at the surface of the reticle mask, or the like.

Moreover, "specific section" means a section formed when the specific pattern is sliced in a specific direction. Slicing in the specific direction is not limited to slicing the specific pattern only at one particular angle. For example, the specific pattern may have a minimum width direction, a maximum width direction and the like.

For example, if a band-like resist pattern is selected as the specific pattern and the specific section is formed by slicing a band-like resist pattern formed with a depth of focus of 0 $\mu$m in a line width direction, then the specific sections of band-like resist patterns formed at depths of focus other than 0 $\mu$m are similarly formed by slicing these other band-like resist patterns in the same line width direction.

As another example, if a circular resist pattern is selected as the specific pattern and the specific section is formed by slicing a circular resist pattern formed with a depth of focus of 0 $\mu$m in a maximum width direction, then the specific sections of circular resist patterns formed at depths of focus other than 0 $\mu$m are similarly formed by slicing these other circular resist patterns in the same maximum width direction.

The function f(F) in Formula (1) is not particularly limited as long as it is a function of the depth of focus F, which is dependent on a top dimension ($\mu$m) and/or an edge dimension ($\mu$m) of the specific section of the specific pattern (which hereafter may be referred to simply as "the specific section"). However, it is required that the specific function f(F) is a function that reflects trends of variation, with respect to the depth of focus, of the top dimension or the edge dimension of the specific section. For example, f(F) may be expressed by the top dimension, the edge dimension, a ratio or the like of the top dimension and the edge dimension, a value obtained by multiplying one of these values by a certain coefficient, or the like. In particular, it is preferable if the function f(F) represents a function that is expressed by the top dimension, the edge dimension, or the ratio top dimension/edge dimension.

Hereafter, methods for finding the upper limit value using these dimensions and ratio will be explained. It is presumed that a band-like resist pattern such as that shown in FIG. 1 is used as the specific pattern, and that the line width direction dimensions of this band-like resist pattern are used, specifically, a top dimension, an edge dimension and a bottom dimension.

Figure 1B:
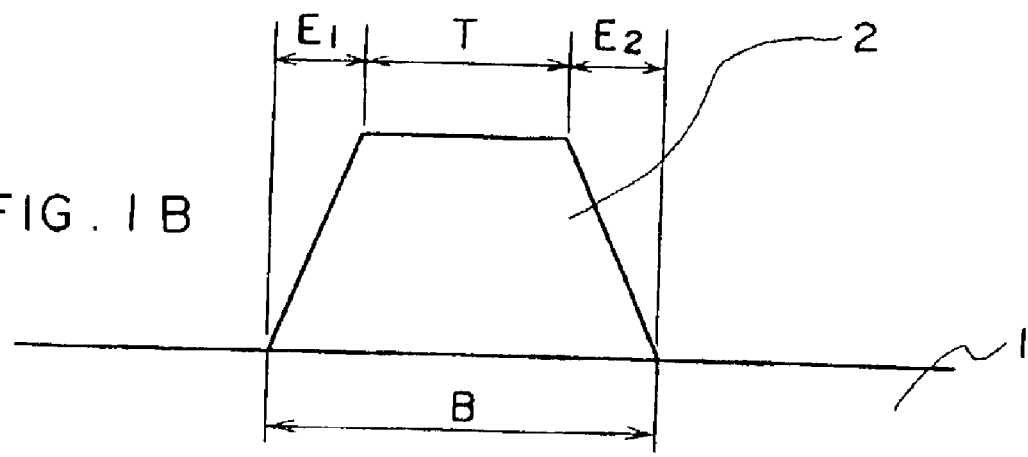
FIG. 1B is a schematic view showing a sectional view of the band-like resist pattern, which shows the dimensions in the line width direction of the band-like resist pattern.
Figure 7A:
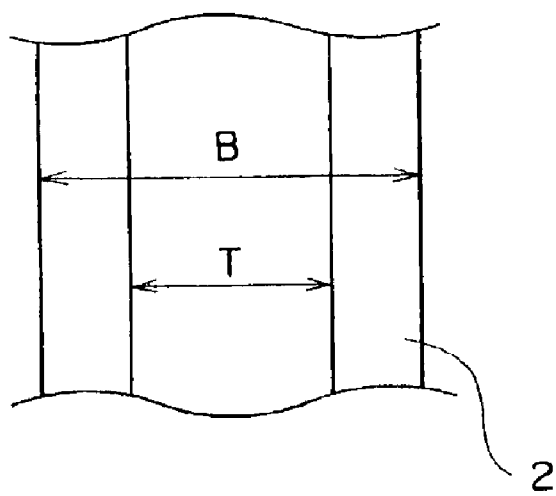
FIG. 7A is a schematic view showing a plan view of a band-like resist pattern.
Figure 7B:
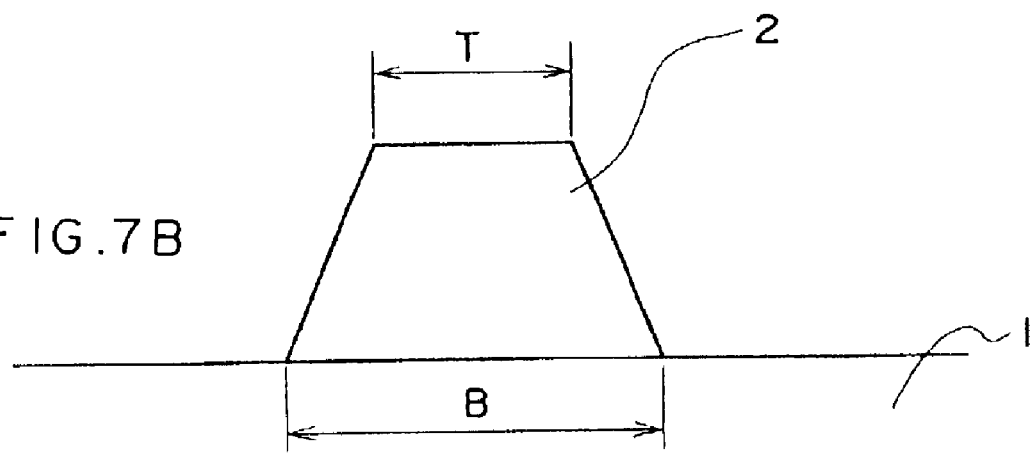
FIG. 7B is a schematic view showing a sectional view of the band-like resist pattern.

FIGS. 1A and 1B are schematic diagrams showing line width direction dimensions of the band-like resist pattern that is used when the upper limit value of the depth of focus is to be determined. FIG. 1A shows a plan view of the band-like resist pattern, and FIG. 1B shows a sectional view (corresponding to the specific section) of the band-like resist pattern. Similarly to FIGS. 7A and 7B,The reference numeral 1, the reference numeral 2, the arrow B and the arrow T represent the wafer, the band-like resist pattern, the bottom dimension (a lower face dimension in a specific direction) and the top direction (an upper face dimension in the specific direction), respectively. Additionally, arrows $E_1$ and $E_2$ represent edge dimensions (slanted portion dimensions in the specific direction).

The top dimension, bottom dimension and edge dimensions in the present invention are not limited only to a band-like resist pattern as shown in FIGS. 1A and 1B. The specific dimensions may similarly be specified for a cross-section of the resist pattern which has a shape other than a shape thereof in the plane of the substrate.

Figure 8:
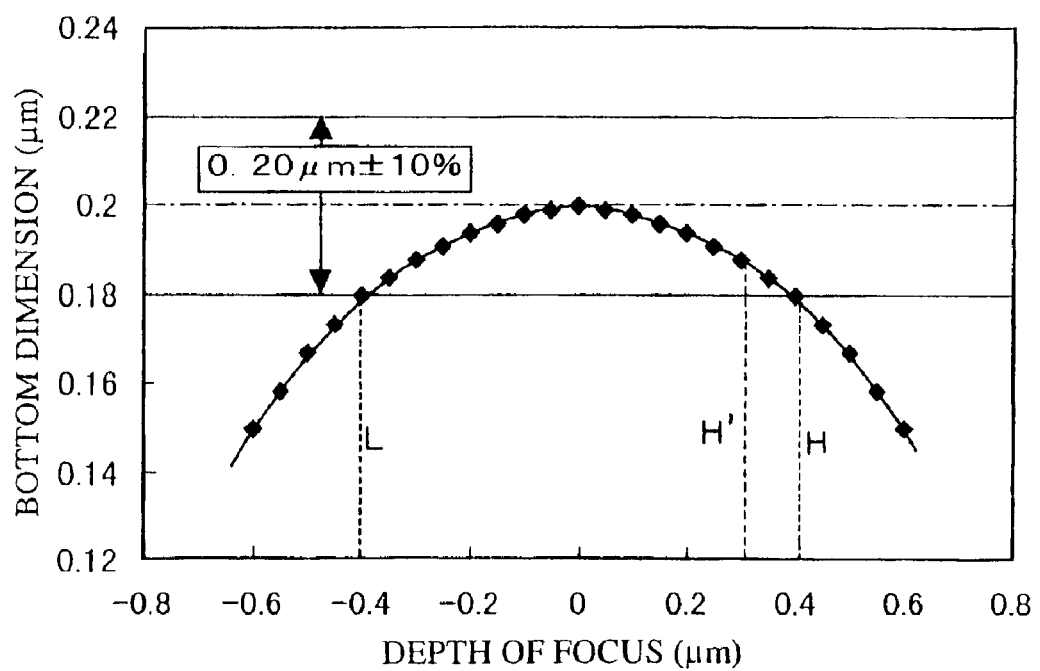
FIG. 8 is an exemplary graph showing changes of a bottom dimension with respect to depth of focus.

Furthermore, in an explanation of a first embodiment of the present invention which is shown below, dimensions of a section in a line width direction of band-like resist patterns, which are formed at respective depths of focus with a reference dimension of 0.2 μm, can be used as the "dimensions of the specific section". These band-like resist patterns with a reference dimension of 0.2 μm have the same dimensional form as band-like resist patterns with a target dimension of 0.2 μm which were used for measurement of the bottom dimensions for the graph shown in FIG. 8.

In the present invention, the "reference dimension" means the bottom dimension when the depth of focus is 0 μm. In order to find an upper limit value of a desired target dimension, it is desirable if the resist pattern formation conditions, other than the depth of focus, are adjusted beforehand such that the reference dimension equals a target dimension.

First Embodiment

In a case where the value Y in Formula (1) is expressed using the top dimension, the value Y can be expressed by the following Formula (2).

$$Y=\text{Top}(F) \hspace{2cm} \text{Formula (2)}$$

In Formula (2), F represents the depth of focus (μm), and Top(F) represents the top dimension (μm) at the specific section of the specific pattern for that depth of focus F.

Figure 2:
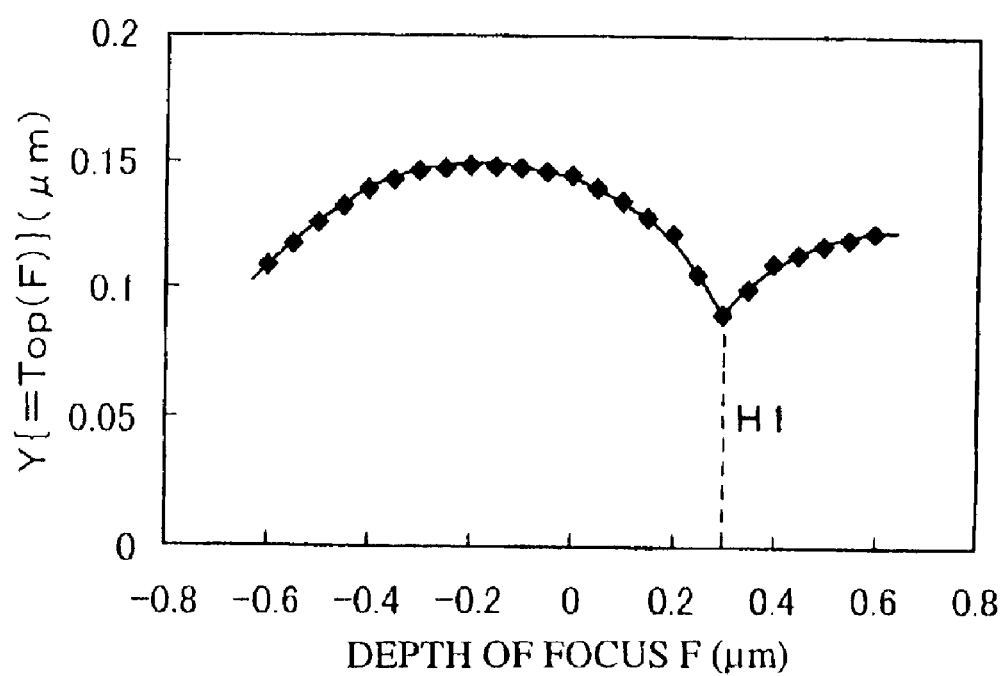
FIG. 2 is an exemplary graph relating to a depth of focus determination method of a first aspect of the present invention.

A graphical representation of Formula (2) is shown in FIG. 2. FIG. 2 shows changes of the top dimension with respect to the depth of focus.

As can be seen in FIG. 2, as the depth of focus increases, the value Y (top dimension) increases. Then, after a maximum, which is exhibited for a depth of focus of −0.2 μm, the value Y temporarily decreases and, after a minimum exhibited for a depth of focus of 0.3 μm, the value Y increases again. Here, the value Y exhibited for the depth of focus of 0.3 μm is a positive value and is a minimum value. Thus, it can be clearly discerned that the depth of focus of 0.3 μm, as shown by a broken line H1 in FIG. 2, is the upper limit value. Not only does this result substantially correspond to the "around about 0.3 μm" result found visually in the prior art; the upper limit value is expressed much more clearly than in the prior art.

Furthermore, when Formula (2) is used for finding the upper limit value of the depth of focus, only measurements of the top dimension need be carried out, and this is convenient.

Second Embodiment

In a case where the value Y in Formula (1) is expressed using the edge dimension, the value Y can be expressed by the following Formula (3).

$$Y=\text{Edge}(F) \hspace{2cm} \text{Formula (3)}$$

In Formula (3), F represents the depth of focus (μm), and Edge(F) represents the edge dimension (μm) at the specific section of the specific pattern for that depth of focus F.

Figure 3:
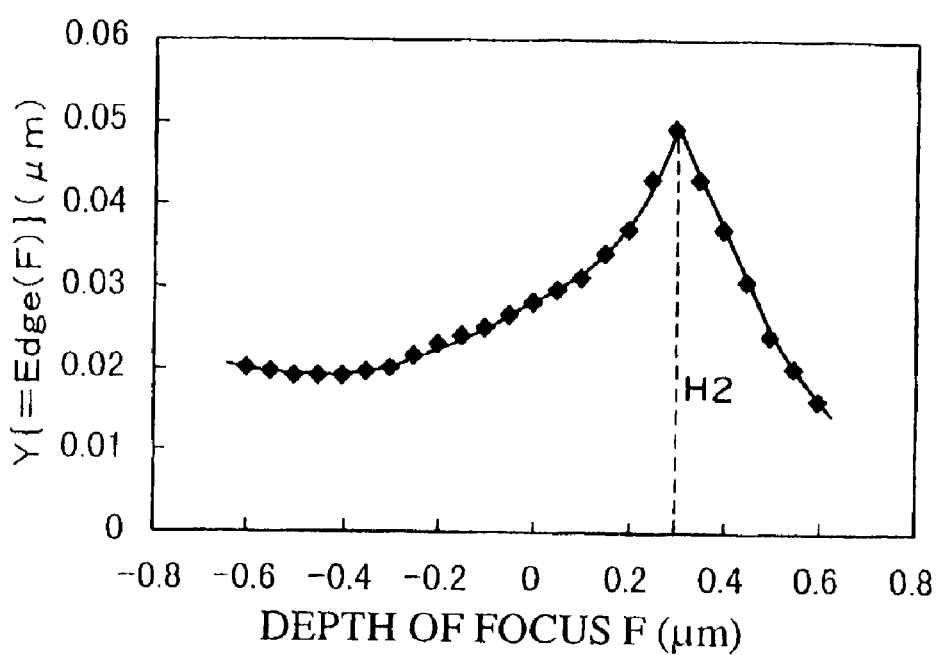
FIG. 3 is another exemplary graph relating to the depth of focus determination method of the first aspect of the present invention.

A graphical representation of Formula (3) is shown in FIG. 3. FIG. 3 shows changes of the edge dimension with respect to the depth of focus.

As can be seen in FIG. 3, as the depth of focus increases, the value Y (edge dimension) increases. Then, after a maximum, which is exhibited for a depth of focus of 0.3 μm, the value Y decreases again. Here, the value Y exhibited for the depth of focus of 0.3 μm is a positive value and is a maximum value. Thus, it can be clearly discerned that the depth of focus of 0.3 μm, as shown by a broken line H2 in FIG. 3, is the upper limit value. Not only does this result substantially correspond to the "around about 0.3 μm" result found visually in the prior art; the upper limit value is expressed much more clearly than in the prior art.

Now, in the first aspect of the present invention and the second aspect of the present invention, which is described later, the edge dimension (hereafter, shortened to "E") that can be used for determining the upper limit value means a dimension or combination of dimensions shown in FIGS. 1A and 1B or the like, such as any one of $E_1$, $E_2$, $(E_1+E_2)/2$ and $(B-T)/2$. In cases where $E_1$ and $E_2$ are not equal, the edge dimension E is preferably a value found from $(E_1+E_2)/2$ or $(B-T)/2$.

Accordingly, when Formula (3) is used for finding the upper limit value of the depth of focus, only measurements of one or two dimensions need be carried out, as described above, and this is convenient.

Third Embodiment

In a case where the value Y in Formula (1) is expressed using the top dimension and the bottom dimension, the value Y can be expressed by the following Formula (4).

$$Y=\text{Top}(F)/\text{Bot}(F) \hspace{2cm} \text{Formula (4)}$$

In Formula (4), F represents the depth of focus (μm), Top(F) represents the top dimension (μm) at the specific section of the specific pattern for that depth of focus F, and Bot(F) represents the bottom dimension (μm) at the specific section of the specific pattern for that depth of focus F.

Figure 4:
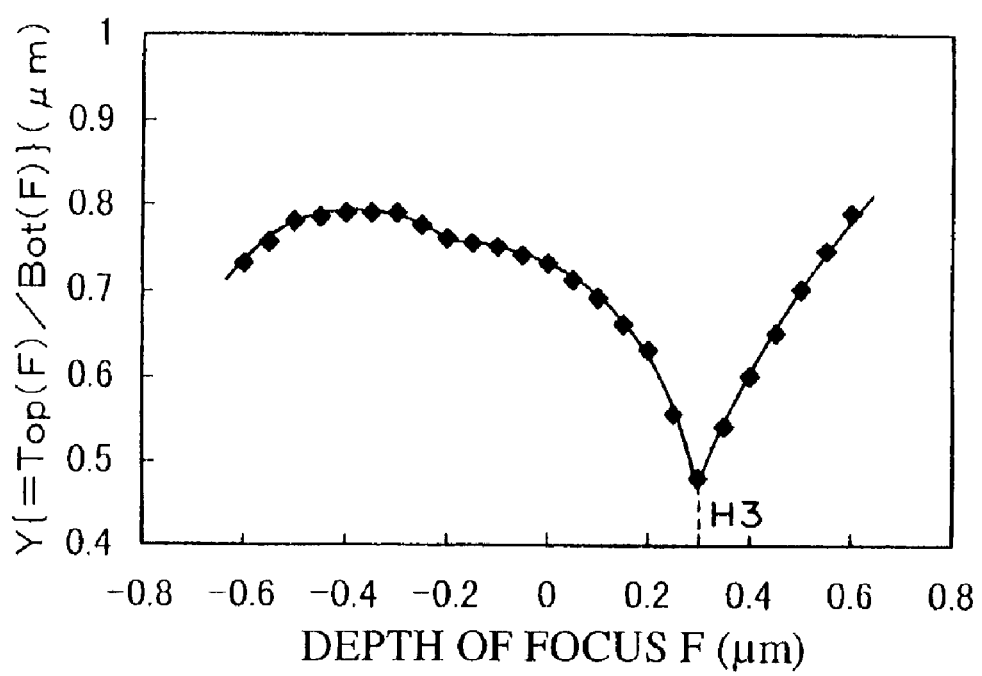
FIG. 4 is yet another exemplary graph relating to the depth of focus determination method of the first aspect of the present invention.

A graphical representation of Formula (4) is shown in FIG. 4. FIG. 4 shows changes of the ratio top dimension/bottom dimension with respect to the depth of focus.

As can be seen in FIG. 4, as the depth of focus increases, the value Y (top dimension/bottom dimension), being a proportional ratio of the top dimension relative to the bottom dimension, increases. Then, after a maximum, which is exhibited for a depth of focus of around −0.4 μm, the value Y temporarily decreases and, after a minimum exhibited for a depth of focus of 0.3 μm, the value Y increases again. Here, the value Y exhibited for the depth of focus of 0.3 μm is a positive value and is a minimum value. Thus, it can be clearly discerned that the depth of focus of 0.3 μm, as shown by a broken line H3 in FIG. 4, is the upper limit value. Not only does this result substantially correspond to the "around about 0.3 μm" result found visually in the prior art; the upper limit value is shown much more clearly than in the prior art.

Furthermore, when Formula (4) is used for finding the upper limit value of the depth of focus, only measurements of the top dimension and the bottom dimension need be carried out, and this is convenient.

Now, the bottom dimension has been known as a finished dimension of a pattern formed on a substrate surface in the prior art. Thus, the bottom dimension has been measured irrespective of the determination of the upper limit value according to the present invention. Moreover, the ratio top dimension/bottom dimension has been utilized since the prior art as a parameter for determining a state of inclination of the edge portions of the resist pattern. Therefore, when Formula (4) is utilized, the upper limit value of the depth of focus can be determined, and at the same time inclination of the edge portions with respect to the depth of focus can be found.

Second Aspect of the Present Invention

The second aspect of the present invention is a method for determining depth of focus which finds an upper limit value of depth of focus for a time of exposure when a resist pattern is being formed. The resist pattern is formed in a resist layer formed on a surface of a substrate, by exposing a reticle mask onto the resist layer by reduction-projection and developing the resist layer.

In this method of determining depth of focus, when the depth of focus at a first specific pattern of the resist pattern is an upper limit value, $F_{max1}$, a value Z expressed by the following Formula (5) exhibits a maximum. When the depth of focus at a second specific pattern of the resist pattern is an upper limit value, $F_{max2}$, the value Z expressed by the following Formula (5) exhibits a minimum. The upper limit value $F_{max1}$ and the upper limit value $F_{max2}$ satisfy the following Formula (6).

$$Z = f_1(F) - f_2(F) \quad \text{Formula (5)}$$

$$0 < F_{max1} < F_{max2} \quad \text{Formula (6)}$$

In Formula (5), F represents depth of focus (μm), $f_1(F)$ represents a function with respect to the depth of focus F, which function is dependent on a top dimension and/or an edge dimension at a specific section of the first specific pattern, and $f_2(F)$ represents a function with respect to the depth of focus F, which function is dependent on a top dimension and/or an edge dimension (μm) at a specific section of the second specific pattern.

That is, according to the second aspect of the invention, a depth of focus determination method can be provided in which an upper limit value of the depth of focus can be determined by taking the difference between two functions that are dependent on the depth of focus, as shown in Formula (5). Consequently, the upper limit value of the depth of focus can be determined with good accuracy and without being affected by inconsistency factors of production processes that relate to the formation of resist patterns.

Formation of the resist pattern is carried out with resist pattern formation conditions, apart from the depth of focus, being constant. Additionally, in the present invention, "first specific pattern" and "second specific pattern" mean two specific patterns (a resist pattern group) having a certain relationship. The two specific patterns are formed by exposing and developing a pattern at a surface of the reticle mask. This pattern is formed with specific dimensions, or specific shapes and dimensions, at mutually different portions thereof. Specifically, the specific patterns satisfy the conditions described below.

That is, a reference dimension B1 at the specific section of the first specific pattern (which may hereinafter be referred to as "the first specific section") must be smaller than a reference dimension B2 at the specific section of the second specific pattern (which may hereinafter be referred to as "the second specific section"). By selecting the reference dimension B1 and the reference dimension B2 in this way, the relationship of Formula (6) can be satisfied.

A ratio of the reference dimension B2 to the reference dimension B1, B2/B1, is not particularly limited, but is preferably at least 1.2. In practice, a ratio in a range from 1.5 to 2.0 is suitable.

If B2/B1 is smaller than 1.2, the upper limit value $F_{max1}$ and the upper limit value $F_{max2}$ will have values which are extremely close. Therefore, Formula (5) may be unable to express a maximum or minimum, at the upper limit value $F_{max1}$ or the upper limit value $F_{max2}$, and specification of the upper limit value may be difficult.

A shape of the first specific pattern and a shape of the second specific pattern may be different. However, it is preferable if the combination of these shapes is a combination of shapes that are the same, such as a band-like resist pattern and a band-like resist pattern, a circular resist pattern and a circular resist pattern, or the like.

In order to find an upper limit value of a desired target dimension, it is desirable if the resist pattern formation conditions, other than the depth of focus, are adjusted beforehand such that either the reference dimension B1 of the first specific section or the reference dimension B2 of the second specific section equals the target dimension.

The function $f_1(F)$ in Formula (5) is not particularly limited as long as it is a function of the depth of focus F which is dependent on a top dimension (μm) and/or an edge dimension (μm) of the first specific section. However, it is required that the function $f_1(F)$ is a function which reflects trends of variation, with respect to the depth of focus, of the top dimension or the edge dimension. For example, the function $f_1(F)$ may be expressed by the top dimension, the edge dimension, a ratio or the like of the top dimension and the edge dimension, a value obtained by multiplying one of these values by a certain coefficient, or the like. In particular, it is preferable if the function $f_1(F)$ represents a function that is expressed by the edge dimension. These preferences similarly apply to the function $f_2(F)$. Further, the function $f_2(F)$ preferably uses substantially the same dimensions that are dependent on the depth of focus (that is, the top dimension, the edge dimension and/or the bottom dimension) and/or combinations thereof as the function $f_1(F)$. Moreover, it is more preferable if the arrangement of coefficients, orders and the like in a mathematical formula of $f_2(F)$ is the same as for $f_1(F)$.

For example, if the function $f_1(F)$ is expressed simply by the edge dimension, then it is preferable if the function $f_2(F)$ is expressed simply by the edge dimension, and if the function $f_1(F)$ is expressed simply by the ratio top dimension/bottom dimension, then it is preferable if the function $f_2(F)$ is expressed simply by the ratio top dimension/bottom dimension.

The second aspect of the present invention determines the upper limit value by trends of variations in the value Z with respect to the depth of focus F, that is, by finding a depth of focus that provides a maximum or minimum value of Z. Accordingly, in view thereof, Formula (5) may be expressed as the following substantially equivalent Formula (5').

$$Z = -f_1(F) + f_2(F) \quad \text{Formula (5')}$$

Definitions of functions and parameters in Formula (5') are the same as in Formula (5).

In Formula (5'), when the depth of focus at the first specific pattern is the upper limit value $F_{max1}$, the value Z expressed by Formula (5') exhibits a minimum, and when the depth of focus at the second specific pattern is the upper limit value $F_{max2}$, the value Z expressed by Formula (5') exhibits a maximum.

An embodiment of the second aspect of the present invention preferably uses a difference, with respect to the depth of focus, between the edge dimension of the first specific section and the edge dimension of the second specific section to find the upper limit value. Of course, it is possible to find the upper limit value of the depth of focus using a difference between the top dimension of the first specific section and the top dimension of the second specific section. However, because dimension differences are unpredictable at depths of focus for which there is hardly any difference between these top dimensions, it is necessary to calculate an offset. Therefore, it is more convenient to use the edge dimensions.

Hereafter, a method for finding the upper limit value using the edge dimensions will be explained. It is presumed that band-like resist patterns such as that shown in FIG. 1 are selected as the first specific pattern and the second specific pattern, and that the line width direction dimensions of this band-like resist pattern are used.

Exemplary Embodiment of the Second Aspect of the Present Invention

In a case where the value Z in Formula (5) is expressed using the edge dimension, the value Z can be expressed by the following Formula (7).

$$Z = \text{Edge}_1(F) - \text{Edge}_2(F) \quad \text{Formula (7)}$$

In Formula (7), F represents the depth of focus ($\mu$m), $\text{Edge}_1(F)$ represents the edge dimension ($\mu$m) at the specific section of the first specific pattern for that depth of focus F, and $\text{Edge}_2(F)$ represents the edge dimension ($\mu$m) at the specific section of the second specific pattern for that depth of focus F.

Figure 5:
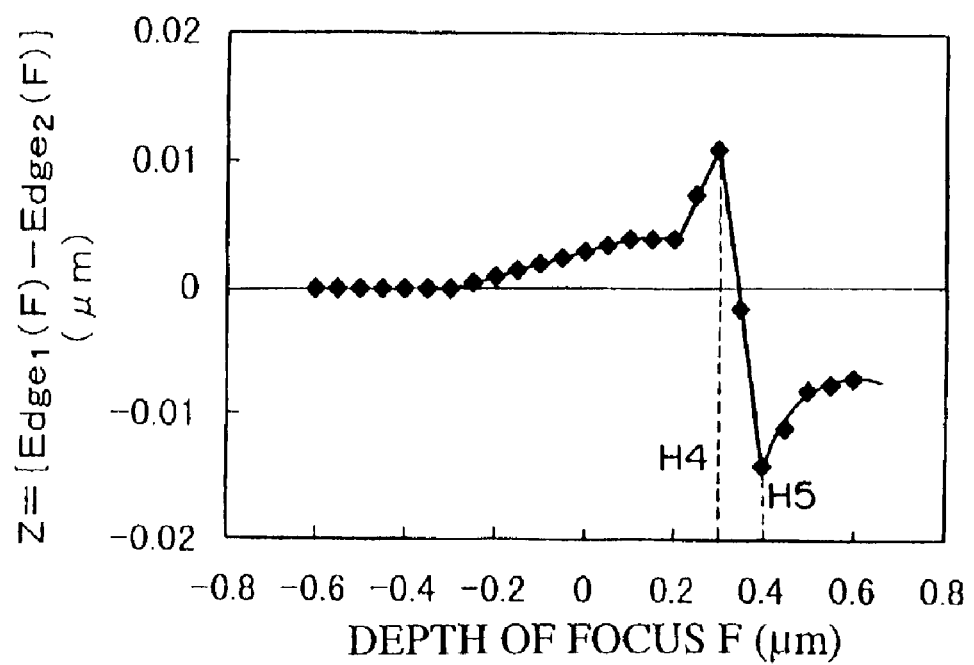
FIG. 5 is an exemplary graph relating to a depth of focus determination method of a second aspect of the present invention.
Figure 6:
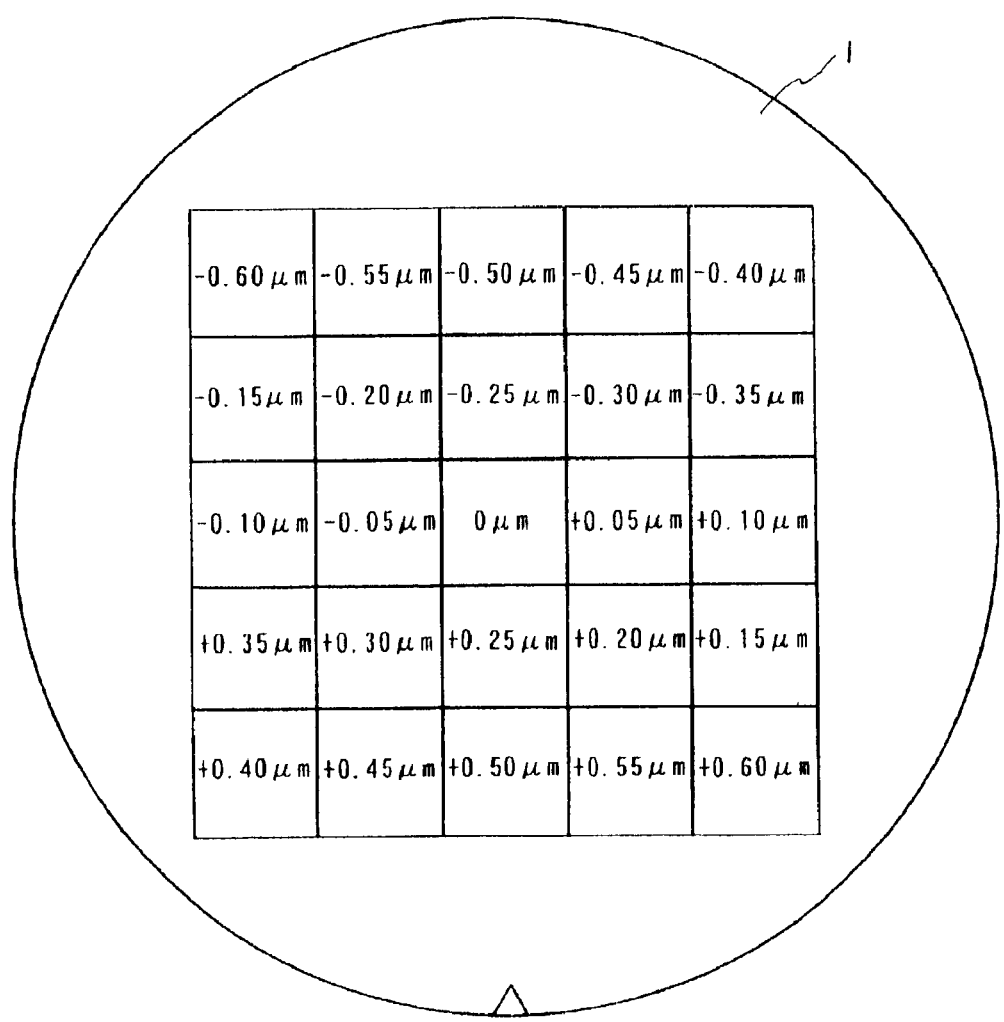
FIG. 6 is a schematic diagram showing an example of resist patterns formed on a surface of a wafer under exposure conditions with respectively different depths of focus.

A graphical representation of Formula (7) is shown in FIG. 5. FIG. 5 shows changes, with respect to the depth of focus, of the difference between the edge dimension of the first specific section and the edge dimension of the second specific section.

A dimension of a section taken in the line width direction of band-like resist patterns, which are formed with a reference dimension of 0.2 $\mu$m at respective depths of focus, can be used as a dimension of the first specific section. These band-like resist patterns with a reference dimension of 0.2 $\mu$m have the same dimensional form as the band-like resist patterns with a target dimension of 0.2 $\mu$m which were used for measurement of the bottom dimensions for the graph shown in FIG. 8.

Meanwhile, a dimension of a section taken in the line width direction of band-like resist patterns with a reference dimension of 0.4 $\mu$m, which are formed at the respective depths of focus, can be used as a dimension of the second specific section.

As can be seen in FIG. 5, as the depth of focus increases, the value Z (the edge dimension of the first specific section minus the edge dimension of the second specific section) increases. Then, after a maximum, which is exhibited for a depth of focus of 0.3 $\mu$m, the value Z temporarily falls sharply and, after a minimum exhibited for a depth of focus of 0.4 $\mu$m, the value Z increases again.

Here, the depth of focus when the value Z is a maximum is smaller than the depth of focus when the value Z is a minimum, and both of these depths of focus are positive values.

Thus, the depth of focus of 0.3 $\mu$m, shown by a broken line H4 in FIG. 5, is an upper limit value of the first specific section, the depth of focus of 0.4 $\mu$m, shown by a broken line H5 in FIG. 5, is an upper limit value of the second specific section, and both of these upper limit values can be clearly discerned.

It can be clearly seen that the clear discernibility of these upper limit values is excellent in comparison to the "around about 0.3 $\mu$m" result found visually in the prior art.

Common Features of the First And Second Aspects of the Present Invention

The depth of focus determination methods according to the first and second aspects of the present invention as described above are extremely effective for finding an upper limit value of the depth of focus when a resist pattern is to be formed on a wafer surface. These methods can, of course, also be used in cases where a resist pattern is to be formed on a substrate surface other than a wafer.

These substrates other than a wafer are not particularly limited as long as the resist layer can be formed thereon. Substrates formed of any of well-known materials, such as glass, ceramics, metal, resin and the like, may be used, provided the surface is flat. Surface roughness, flatness and the like thereof are preferably in a small range and, specifically, are preferably at levels comparable to semiconductor substrates such as silicon wafers and the like.

Furthermore, the resist used for forming the resist pattern (a photosensitive resin composition) is not particularly limited among well-known resists. A negative resist or a positive resist may be used. Moreover, the thickness of the resist layer formed on the substrate surface is not particularly limited. Commonly, a resist layer having a thickness of from 200 nm to 20,000 nm will be desired.

Exposure processing of the resist layer formed at the substrate surface is not particularly limited, as long as it is implemented using an exposure apparatus capable of reduction-projection of a reticle mask. Currently, a reduction ratio of reduction-projection is generally expected to be in a range from 4 to 5. However, reduction ratios in other ranges may be used.

Furthermore, development processing, which is implemented after the exposure processing, may be performed using a well-known developing fluid in accordance with the type of resist used, the exposure processing conditions, and the like.

What is claimed is:

1. A method for determining depth of focus in a process for forming a resist pattern, the process for forming the resist pattern including forming a resist layer on a substrate surface, the resist layer including a plurality of subpatterns, each of which has one of a plurality of values of depth of focus and has a common value of exposure amount;

exposing the resist layer with a reticle mask by reduction-projection; and developing the resist layer, the method for determining depth of focus comprising:

measuring, for the plurality of values of the depth of focus, at least one of a top dimension and an edge dimension of a specific section of a specific pattern of a resist pattern;

determining, for each of the plurality of values of the depth of focus, a value Y expressed by the following Formula (1):

$$Y=f(F) \qquad \text{Formula (1)}$$

in which F represents the depth of focus and f(F) represents a function of the depth of focus F, which includes said at least one of a top dimension and an edge dimension; and finding an upper limit value of the depth of focus at a time of exposing the reticle mask, which upper limit value is a positive value $F_{max}$ at which the value Y exhibits one of a maximum and a minimum.

2. The method for determining depth of focus of claim 1, wherein the value Y in Formula (1) is expressed by the following Formula (2):

$$Y=\text{Top}(F) \qquad \text{Formula (2)}$$

and in Formula (2), F represents the depth of focus and Top(F) represents the top dimension of the specific section of the specific pattern for that depth of focus.

3. The method for determining depth of focus of claim 1, wherein the value Y in Formula (1) is expressed by the following Formula (3):

$$Y=\text{Edge}(F) \qquad \text{Formula (3)}$$

and in Formula (3), F represents the depth of focus, and Edge(F) represents the edge dimension of the specific section of the specific pattern for that depth of focus.

4. The method for determining depth of focus of claim 1, wherein the value Y in Formula (1) is expressed by the following Formula (4):

$$Y=\text{Top}(F)/\text{Bot}(F) \qquad \text{Formula (4)}$$

and in Formula (4), F represents the depth of focus, Top(F) represents the top dimension of the specific section of the specific pattern for that depth of focus, and Bot(F) represents a bottom dimension of the specific section of the specific pattern for that depth of focus.

5. A method for determining depth of focus for forming a resist pattern, the process for forming the resist pattern including:

forming a resist layer on a substrate surface, the resist layer including a plurality of subpatterns, each of which has one of a plurality of values of depth of focus and has a common value of exposure amount;

exposing the resist layer with a reticle mask by reduction-projection; and developing the resist layer, the method for determining depth of focus comprising:

finding an upper limit value of the depth of focus at a time of exposing the reticle mask, wherein, if the depth of focus at a first specific pattern of the resist pattern is at an upper limit value $F_{max1}$, a value Z expressed by the following Formula (5) exhibits a maximum, and if the depth of focus at a second specific pattern of the resist pattern is at an upper limit value $F_{max2}$, the value Z expressed by the following Formula (5) exhibits a minimum, the upper limit value $F_{max1}$ and the upper limit value $F_{max2}$ satisfy a relationship represented by the following Formula (6):

$$Z=f_1(F)-f_2(F) \qquad \text{Formula (5)}$$

$$0<F_{max1}<F_{max2} \qquad \text{Formula (6)}$$

and in Formula (5), F represents the depth of focus, $f_1(F)$ represents a function of the depth of focus F which includes at least one of a top dimension and an edge dimension of a specific section of the first specific pattern, and $f_2(F)$ represents a function of the depth of focus F which includes at least one of a top dimension and an edge dimension of a specific section of the second specific pattern.

6. The method for determining depth of focus of claim 5, wherein the value Z in Formula (5) is expressed by the following Formula (7):

$$Y=\text{Edge}_1(F)-\text{Edge}_2(F) \qquad \text{Formula (7)}$$

and in Formula (7), F represents the depth of focus, $\text{Edge}_1(F)$ represents the edge dimension of the specific section of the first specific pattern for that depth of focus, and $\text{Edge}_2(F)$ represents the edge dimension of the specific section of the second specific pattern for that depth of focus.

7. A method for determining an upper limit value of depth of focus of an exposure apparatus comprising:

providing a plurality of resist patterns under exposure conditions with respectively different depths of focus and with a same exposure amount;

measuring an upper face dimension in a specific direction of each of the plurality of resist patterns;

detecting a point at which the upper face dimension is a minimum value; and determining the upper limit value of depth of focus from the detected point, under a condition wherein the upper limit value of depth of focus is positive.

8. A method for determining an upper limit value of depth of focus of an exposure apparatus comprising:

providing a plurality of resist patterns under exposure conditions with respectively different depths of focus and with a same exposure amount;

measuring an upper face dimension in a specific direction and a lower face dimension in the specific direction of each of the plurality of resist patterns;

calculating, from the upper face dimension and the lower face dimension, an inclination portion dimension in the specific direction;

detecting a point at which the inclination portion dimension is a maximum value; and determining the upper limit value of depth of focus from the detected point, under a condition wherein the upper limit value of depth of focus is positive.

9. The method for determining an upper limit value of depth of focus of claim 8, wherein calculating an inclination portion dimension comprises dividing a value obtained by subtracting the upper face dimension from the lower face dimension by 2.

10. A method for determining an upper limit value of depth of focus of an exposure apparatus comprising:

providing a plurality of resist patterns under exposure conditions with respectively different depths of focus and with a same exposure amount;

measuring an upper face dimension in a specific direction and a lower face dimension in the specific direction of each of the plurality of resist patterns;

finding a proportional ratio of the upper face dimension relative to the lower face dimension;

detecting a point at which the proportional ratio is a minimum value; and determining the upper limit value of depth of focus from the detected point, under a condition wherein the upper limit value of depth of focus is positive.

11. A method for determining an upper limit value of depth of focus of an exposure apparatus comprising:

providing a plurality of resist pattern groups under exposure conditions with respectively different depths of focus and with a same exposure amount, the resist pattern groups including a first pattern and a second pattern, wherein a dimension of the second pattern in a specific direction is greater than a dimension of the first pattern in the specific direction;

measuring an upper face dimension of the first pattern in the specific direction and a lower face dimension of the first pattern in the specific direction;

calculating, from the upper face dimension of the first pattern and the lower face dimension of the first pattern, an inclination portion dimension of the first pattern in the specific direction;

measuring an upper face dimension of the second pattern in the specific direction and a lower face dimension of the second pattern in the specific direction;

calculating, from the upper face dimension of the second pattern and the lower face dimension of the second pattern, an inclination portion dimension of the second pattern in the specific direction;

finding a value by subtracting the inclination portion dimension of the second pattern from the inclination portion dimension of the first pattern;

detecting a point at which the value found by subtracting the inclination portion dimension of the second pattern from the inclination portion dimension of the first pattern is a maximum value; and determining the upper limit value of depth of focus from the detected point, under a condition wherein the upper limit value of depth of focus is positive.

12. The method for determining an upper limit value of depth of focus of claim 11, wherein the dimension of the second pattern in the specific direction is at least 1.2 times the dimension of the first pattern in the specific direction.

13. The method for determining an upper limit value of depth of focus of claim 11, wherein calculating an inclination portion dimension of the first pattern comprises dividing a value obtained by subtracting the upper face dimension of the first pattern from the lower face dimension of the first pattern by 2, and calculating an inclination portion dimension of the second pattern comprises dividing a value obtained by subtracting the upper face dimension of the second pattern from the lower face dimension of the second pattern by 2.

* * * * *